United States Patent
Mehrotra et al.

(10) Patent No.: US 7,211,481 B2
(45) Date of Patent: May 1, 2007

(54) METHOD TO STRAIN NMOS DEVICES WHILE MITIGATING DOPANT DIFFUSION FOR PMOS USING A CAPPED POLY LAYER

(75) Inventors: Manoj Mehrotra, Plano, TX (US);
Lahir Shaik Adam, Plano, TX (US);
Song Zhao, Plano, TX (US);
Mahalingam Nandakumar, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 324 days.

(21) Appl. No.: 11/060,841

(22) Filed: Feb. 18, 2005

(65) Prior Publication Data

US 2006/0189048 A1    Aug. 24, 2006

(51) Int. Cl.
*H01L 21/8238* (2006.01)
(52) U.S. Cl. .................. 438/228; 438/231; 438/902; 257/E21.63
(58) Field of Classification Search .......... 257/E21.63; 438/228–231, 902
See application file for complete search history.

(56) References Cited

U.S. PATENT DOCUMENTS

| | | | |
|---|---|---|---|
| 6,165,826 A * | 12/2000 | Chau et al. ............ | 438/231 |
| 6,180,454 B1 | 1/2001 | Chang et al. | |
| 6,380,029 B1 | 4/2002 | Chang et al. | |
| 6,495,853 B1 | 12/2002 | Holbrook et al. | |
| 6,767,778 B2 | 7/2004 | Wang et al. | |
| 7,129,127 B2 * | 10/2006 | Chidambaram et al. .... | 438/231 |
| 2005/0136583 A1 * | 6/2005 | Chen et al. ............. | 438/199 |

* cited by examiner

*Primary Examiner*—Richard A. Booth
(74) *Attorney, Agent, or Firm*—Peter K. McLarty; W. James Brady, III; Frederick J. Telecky, Jr.

(57) ABSTRACT

The present invention facilitates semiconductor fabrication by providing methods of fabrication that apply tensile strain to channel regions of devices while mitigating unwanted dopant diffusion, which degrades device performance. Source/drain regions are formed in active regions of a PMOS region (102). A first thermal process is performed that activates the formed source/drain regions and drives in implanted dopants (104). Subsequently, source/drain regions are formed in active regions of an NMOS region (106). Then, a capped poly layer is formed over the device (108). A second thermal process is performed (110) that causes the capped poly layer to induce strain into the channel regions of devices. Because of the first thermal process, unwanted dopant diffusion, particularly unwanted p-type dopant diffusion, during the second thermal process is mitigated.

20 Claims, 8 Drawing Sheets

METHOD TO STRAIN NMOS DEVICES WHILE MITIGATING DOPANT DIFFUSION FOR PMOS USING A CAPPED POLY LAYER

FIELD OF INVENTION

The present invention relates generally to semiconductor devices and more particularly to transistors and associated methods of manufacture having improved mobility due to channel strain.

BACKGROUND OF THE INVENTION

A conventional MOS transistor generally includes a semiconductor substrate, such as silicon, having a source, a drain, and a channel positioned between the source and drain. A gate stack composed of a conductive material (a gate conductor), a dielectric layer (a gate oxide), and sidewall spacers, is typically located above the channel. The gate oxide is typically located directly above the channel, while the gate conductor, generally comprised of polycrystalline silicon (polysilicon) material, is located above the gate oxide. The sidewall spacers protect the sidewalls of the gate conductor and define the source and drain placement relative to the gate.

Generally, for a given electric field across the channel of a MOS transistor, the amount of current that flows through the channel is directly proportional to the mobility of carriers in the channel. Thus the higher the mobility of the carriers in the channel, the more rapidly the carriers will pass through the channel and the faster a circuit can perform when using high mobility MOS transistors. Additionally, improving the mobility of the carriers in the channel can allow device operation at lower voltages.

A number of techniques can be employed to improve mobility of the carriers in the channel. One technique is to place the direction of the channel, and thus the carrier flow, with a certain alignment regarding one of the substrate crystal planes (e.g., 100). The drawback of this technique is that a given orientation that would be beneficial to one carrier type (e.g., holes) would not benefit the other carrier type (e.g., electron).

Another technique to increase the mobility of the carriers in the channel of an MOS transistor is to produce a mechanical stress or strain in the channel. A compressive strained channel typically provides hole mobility enhancement, which is particularly beneficial for PMOS devices, whereas a tensile strained channel typically provides electron mobility enhancement, which is particularly beneficial for NMOS devices. Generally, strain may be imparted when a layer is formed adjacent to the channel that has a lattice mismatch between the formed layer and the substrate and channel. The lattice mismatch then induces strain across a channel region.

One drawback to improving channel mobility via strain is that compressive strain, which generally improves hole mobility for silicon substrate devices, can degrade electron mobility and that tensile strain, which improves electron mobility for silicon substrate based devices, can also degrade hole mobility. As a result, introducing tensile strain can improve performance of NMOS devices but degrade performance of PMOS devices. Similarly, introducing compressive strain can improve performance of PMOS devices but degrade performance of NMOS devices.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention facilitates semiconductor fabrication by applying tensile stress to channel regions of NMOS devices while mitigating degradation to PMOS devices due to undesired p-type dopant diffusion. The present invention forms source/drain regions in the PMOS region and then performs a thermal process that mitigates p-type dopant diffusion during formation of a capped poly layer and subsequent strain inducing thermal process.

The present invention forms and activates source/drain regions within a PMOS region prior to forming a capped poly layer. A thermal process is performed after forming the source/drain regions that activates the dopants. Subsequently, source/drain regions are formed within an NMOS region, but a thermal process is not immediately performed. A capped poly layer is formed over the device followed by another thermal process that activates the implanted dopants within the NMOS region and causes tensile stress to be induced to channel regions of the device. The tensile stress improves channel mobility for NMOS transistor devices formed within the NMOS region and does not substantially degrade performance for PMOS transistor devices formed within the PMOS region. The source/drain formation and activation within the PMOS region performed before formation of the capped poly layer mitigate dopant diffusion during the later stress inducing thermal process. As a result, performance degradation of the PMOS transistor devices within the PMOS region is limited or prevented.

The following description and annexed drawings set forth in detail certain illustrative aspects and implementations of the invention. These are indicative of but a few of the various ways in which the principles of the invention may be employed.

DETAILED DESCRIPTION OF THE INVENTION

One or more implementations of the present invention will now be described with reference to the attached drawings, wherein like reference numerals are used to refer to like elements throughout, and wherein the illustrated structures are not necessarily drawn to scale. The invention provides transistor structures and methods in which transistor mobility is improved while reducing masks employed in fabrication thereof.

The present invention facilitates semiconductor fabrication by providing methods of fabrication that induce stress/strain to channel regions of transistor devices. The present invention forms source/drain regions within a PMOS region followed by a first thermal process that activates the formed source/drain regions and drives in implanted dopants. Afterward, a capped poly layer is formed followed by a strain inducing thermal process that induces stress into channel regions within an NMOS region via the capped poly layer. Unwanted dopant diffusion from the PMOS region into the capped poly layer is mitigated because of the first thermal process. As a result, channel mobility and/or performance of devices located in the PMOS region is not substantially degraded.

Conventionally, PMOS and NMOS source/drain regions and a capped poly layer are formed over a device and then subjected to a thermal process, which activated the source/drain regions and induced tensile strain to channel regions of the device. The inventors of the present invention appreciate that the induced strain improves electron mobility and, therefore, performance of NMOS devices, but the capped poly layer and thermal process degrade performance of PMOS devices. The inventors of the present invention also appreciate that the composition of the capped poly layer, particularly when subjected to the thermal process, can deleteriously impact other characteristics of PMOS devices, such as by altering dopant profile, diffusability of implanted dopants, and the like.

One mechanism that can be employed to mitigate degradation of PMOS device performance and yet improve NMOS device performance via a capped poly layer is to employ a separate mask and remove a portion of the capped poly layer immediately prior to performing a thermal process. However, so doing requires a separate mask step thereby increasing fabrication time, cost, and possibility of defects.

Figure 1:
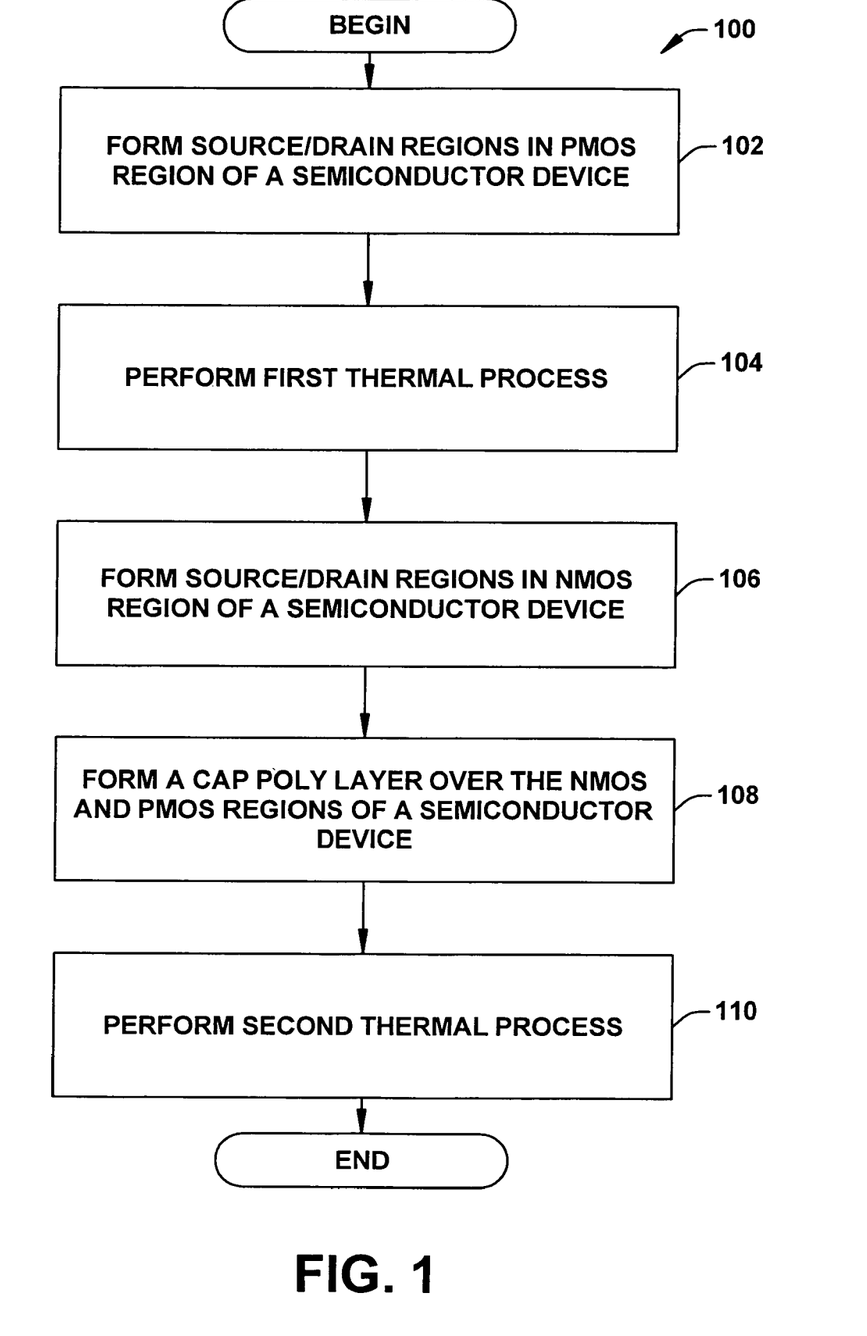
FIG. 1 is a flow diagram illustrating a method of fabricating a semiconductor device that introduces strain/stress into channel regions of transistor while mitigating undesired dopant diffusion within a PMOS region in accordance with an aspect of the present invention.

FIG. 1 is a flow diagram illustrating a method 100 of fabricating a semiconductor device that introduces strain/stress into channel regions of a transistor while mitigating undesired dopant diffusion and/or loss within a PMOS region in accordance with an aspect of the present invention. The method 100 generally operates with a semiconductor device having NMOS and PMOS regions.

The method 100 begins at block 102 wherein source/drain regions are formed in active areas of a PMOS region by selectively implanting a p-type dopant. Typically, a layer of resist is formed and patterned to expose the PMOS region while covering an NMOS region. Subsequently, the p-type dopant is implanted at a selected energy and dose to form the source/drain regions having a selected dopant concentration and dopant profile.

Continuing at block 104, a thermal process is performed that activates the implanted p-type dopant and drives the p-type dopants into the underlying silicon or substrate. A capped poly layer is not present yet, and, as a result, loss of the implanted p-type dopant is mitigated in later thermal processes. The thermal process is typically a spike anneal, so as be compatible with a specified thermal budget. Generally, thermal budgets are set for fabrication of semiconductor devices in order to prevent or mitigate damage from over-exposure to thermal processes. A suitable, exemplary spike anneal is about 900 to about 1050 degrees Celsius for a relatively short duration (e.g., about 5 seconds or less).

Continuing at block 106, source/drain regions are formed in active areas of the NMOS region by selectively implanting an n-type dopant. Typically, a layer of resist is formed and patterned to expose the NMOS region while covering the PMOS region. Subsequently, the n-type dopant is implanted at a selected energy and dose to form the source/drain regions having a selected dopant concentration and dopant profile.

A capped poly layer, also referred to as a stacked poly cap or poly cap layer, is formed over the NMOS and PMOS regions of the semiconductor device at block 108. The capped poly layer is formed by depositing and/or growing one or more layers of materials (e.g., oxide, nitride, and the like) that introduce a desired type of strain in the NMOS region of the device when subjected to a thermal process. Generally, the capped poly layer is formed over active regions and gate electrodes of transistor devices in both the NMOS region and a PMOS region of the semiconductor device. A suitable capped poly layer is comprised of a lower insulative layer (e.g., oxide) and a middle layer formed on the lower layer comprised of a suitable material and thickness that introduces a desired amount of strain (e.g., nitride). However, the capped poly layer can comprise additional layers.

A second thermal process (e.g., an anneal) is performed at block 110 that causes the capped poly layer to introduce a type of strain (e.g., uniaxial tensile strain or biaxial tensile strain) across channel regions of transistor devices and enhance performance of transistor devices within the NMOS region. The second thermal process also generally activates the source/drain regions formed within the NMOS region. A suitable second thermal process is a spike anneal that occurs for a relatively short time at a high temperature (e.g., about 800 degrees Celsius to 1200 degrees Celsius). A thickness and/or composition of the capped poly layer determines the magnitude of strain introduced into the channel regions. The time and temperature of the anneal process can be selected to further select or adjust the amount of strain introduced. Typically, a higher temperature and/or longer time for the anneal process results in a greater amount of strain being applied.

It is noted that the formation of source/drain regions in the PMOS region and performance of the first thermal process mitigate diffusion of the implanted p-type dopants (e.g., boron) into the capped poly layer. Other conventional fabrication mechanisms can require a portion of the capped poly layer to be removed, selectively from the PMOS region, thereby requiring additional masks and processing steps. Still other conventional fabrication mechanisms can limit the thickness of the capped poly layer in order to mitigate undesired PMOS dopant diffusion, but this also limits improvement to the NMOS devices within the NMOS region.

Subsequently, the capped poly layer is removed, which allows additional fabrication procedures, such as silicidation and metallization, to be performed. One suitable mechanism to remove the capped poly layer is to employ a plasma dry etch selective to an underlying layer to remove the capped poly layer. For example, for a cap poly comprising an oxide covered by a nitride, a two-step etch process may be employed, wherein the first etch is selective to the oxide and the second etch is selective to the underlying layer.

Figure 2A:
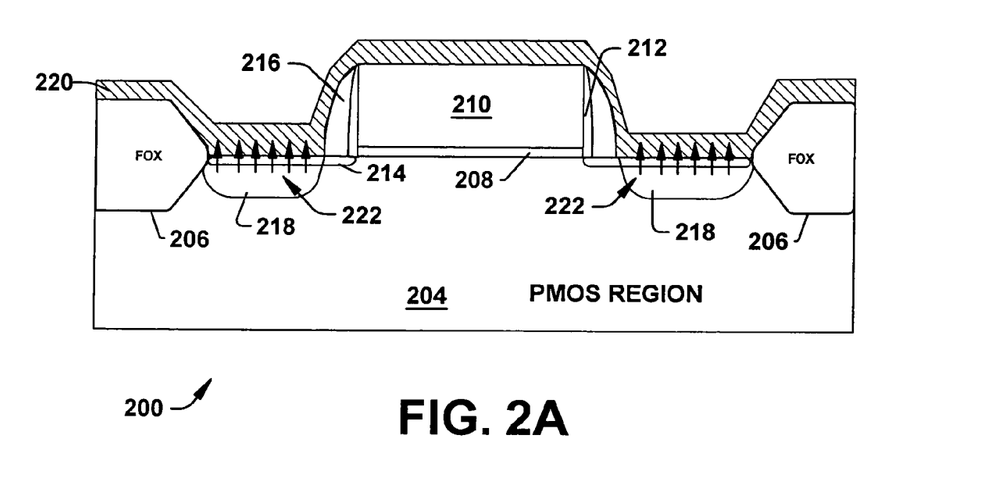
FIG. 2A is a cross sectional view of a p-type transistor device during a stress inducing thermal process.

FIG. 2A is a cross sectional view of a p-type transistor device 200 having a capped poly layer thereover during a stress inducing thermal process. This thermal process degrades performance of the device 200 because of undesirable dopant diffusion.

The p-type transistor device 200 includes an n-type well region 204 comprised of a semiconductor material, such as silicon, which is selectively doped with an n-type dopant. Isolation structures 206 are also present to define various active areas and electrically isolate various active areas laterally from one another. Some examples of suitable isolation structures include shallow trench isolation (STI) regions, field oxide regions (LOCOS), and the like.

A gate dielectric layer 208 and a conductive gate layer 210 form formed over the device 200 and patterned to form a gate structure. In one example, the gate dielectric layer 208 comprises a thin, thermally grown silicon dioxide layer, however, other type gate dielectrics (such as high-k dielectrics) may be formed and are contemplated by the present invention. The conductive gate layer 210 is formed on the gate dielectric layer 210 and comprises a conductive material, such as polysilicon. As an example of a conductive gate layer 210 formation process, a polysilicon layer may be deposited via chemical vapor deposition (CVD). Subsequently, a suitable patterning operation is performed to form the gate structures.

Offset spacers are formed on lateral edges of the gate structure. The offset spacers 212 can be formed by forming a thin offset layer (e.g., an oxide or nitride layer) conformally over the gate structure and then performing an anisotropic dry etch to remove offset layer material on top of the gate and in active regions, leaving a thin offset spacer material on lateral edges of the gate structure.

Extension regions 214 are formed within the active regions by introducing p-type dopants into the active regions. As an example, lightly doped, medium doped or heavily doped extension region implants, wherein the gate structure serves to self-align, can be employed to form the extension regions 214.

Sidewall spacers 216 are then formed on the gate structures. The sidewall spacers 216 comprise an insulating material such as an oxide, a nitride or a combination of such layers. The spacers are formed by depositing a layer of such spacer material(s) over the device in a generally conformal manner, followed by an anisotropic etch thereof, thereby removing such spacer material from the top of the gate structure and from the moat or active area and leaving a region on the lateral edges of the gate structure, overlying the offset spacers. The sidewall spacers are substantially thicker than the offset spacers, thereby resulting in subsequently formed source/drain regions to be offset from lateral edges of the gate.

Source/drain regions 218 are formed by implanting p-type dopants (e.g., boron into exposed portions of the active regions. The sidewall spacers 216 serve to offset the source/drain regions from lateral edges of the gate structures.

A strain inducing capped poly layer 220 is formed over the device 200. The capped poly layer 220 is comprised of one or more layers that induce strain when subjected to a thermal process. A composition and thickness of layers comprising the capped poly layer are selected to attain a desired amount and type of strain as well as protect underlying layers/regions of the device.

A thermal process is performed that causes the capped poly layer 220 to induce strain into channel regions of the device. The thermal process can also activate the source/drain regions 218. Generally, the strain inducing capped poly layer 220 induces tensile strain, which enhances electron mobility for n-type transistor devices. However, this thermal process also results in a portion of implanted p-type dopants from the source/drain regions 218 to diffuse 222 into the capped poly layer 220. As a result of this undesirable diffusion, performance of the p-type transistor device 200 is degraded. For example, undesirable diffusion of boron, a p-type dopant, into the capped poly layer results in lower drive current for the p-type transistor device 200.

Figure 2B:
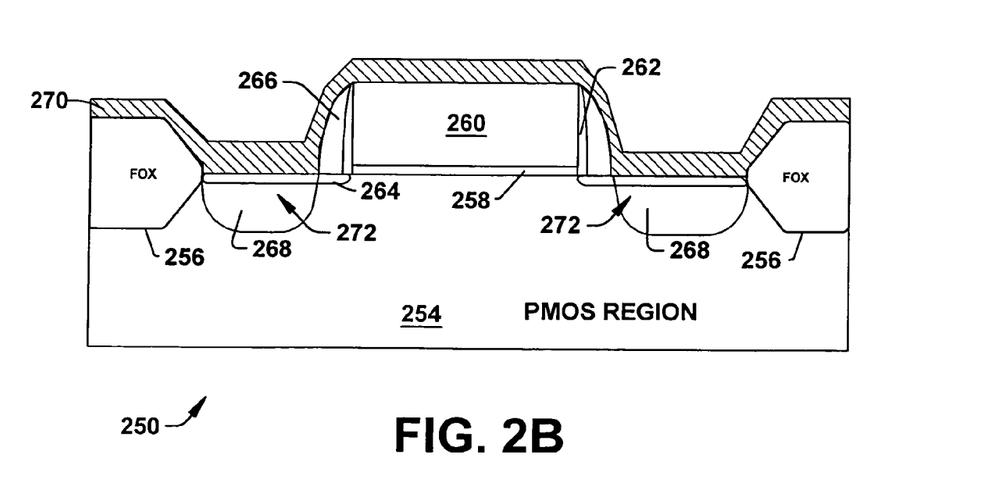
FIG. 2B is a cross sectional view of a p-type transistor device during a stress inducing thermal process in accordance with an aspect of the present invention.

FIG. 2B is a cross sectional view of a p-type transistor device 250 during a stress inducing thermal process in accordance with an aspect of the present invention. Previously, a prior thermal process was employed to activate p-type source/drain regions 268 and drive in implanted dopants. As a result, undesirable dopant diffusion from the source/drain regions 268 into a capped poly layer 270 is mitigated.

The p-type transistor device 250 includes an n-type well region 254 comprised of a semiconductor material, such as silicon, which is selectively doped with an n-type dopant. Isolation structures 256 are also present to define various active areas and electrically isolate various active areas laterally from one another. Some examples of suitable isolation structures include shallow trench isolation (STI) regions, field oxide regions (LOCOS), and the like, as shown above.

A gate dielectric layer 258 and a conductive gate layer 260 form formed over the device 250 and patterned to form a gate structure. In one example, the gate dielectric layer 258 comprises a thin, thermally grown silicon dioxide layer, however, other type gate dielectrics (such as high-k dielectrics) may be formed and are contemplated by the present invention. The conductive gate layer 260 is formed on the gate dielectric layer 260 and comprises a conductive material, such as polysilicon. As an example of a conductive gate layer 260 formation process, a polysilicon layer may be deposited via chemical vapor deposition (CVD). Subsequently, a suitable patterning operation is performed to form the gate structures.

Offset spacers are formed on lateral edges of the gate structure. The offset spacers 262 can be formed by forming a thin offset layer (e.g., an oxide or nitride layer) i conformally over the gate structure and then performing an anisotropic dry etch to remove offset layer material on top of the gate and in active regions, leaving a thin offset spacer material on lateral edges of the gate structure.

Extension regions 264 are formed within the active regions by introducing p-type dopants into the active regions. As an example, lightly doped, medium doped or heavily doped extension region implants, wherein the gate structure serves to self-align, can be employed to form the extension regions 264.

Sidewall spacers 266 are then formed on the gate structures. The sidewall spacers 266 comprise an insulating material such as an oxide, a nitride or a combination of such layers. The spacers are formed by depositing a layer of such spacer material(s) over the device in a generally conformal manner, followed by an anisotropic etch thereof, thereby removing such spacer material from the top of the gate structure and from the moat or active area and leaving a region on the lateral edges of the gate structure, overlying the offset spacers. The sidewall spacers are substantially thicker than the offset spacers, thereby resulting in subsequently formed source/drain regions to be offset from lateral edges of the gate.

Source/drain regions 268 are formed by implanting p-type dopants (e.g., boron) into exposed portions of the active regions. The sidewall spacers 266 serve to offset the source/drain regions from lateral edges of the gate structures. Subsequently, a first thermal process, such as a rapid thermal anneal, is performed to activate and drive in the implanted p-type dopants.

A strain inducing capped poly layer 270 is formed over the device 250 after the first thermal process. The capped poly layer 270 is comprised of one or more layers that induce strain when subjected to a thermal process. A composition and thickness of layers comprising the capped poly layer are selected to attain a desired amount and type of strain as well as protect underlying layers/regions of the device.

A second, strain inducing thermal process is performed that causes the capped poly layer 270 to induce strain into channel regions of the device. The second thermal process may also activate n-type source drain regions in NMOS devices, however the source/drain regions 268 are already activated due to the first thermal process. Generally, the strain inducing capped poly layer 270 induces tensile strain, which enhances electron mobility for n-type transistor devices. Because of the first thermal process that drove in the p-type dopants, undesirable diffusion of dopants into the capped poly layer 270 is mitigated. As a result, performance of n-type transistor devices can be improved without substantially degrading performance of the p-type transistor device 200.

Figure 3:
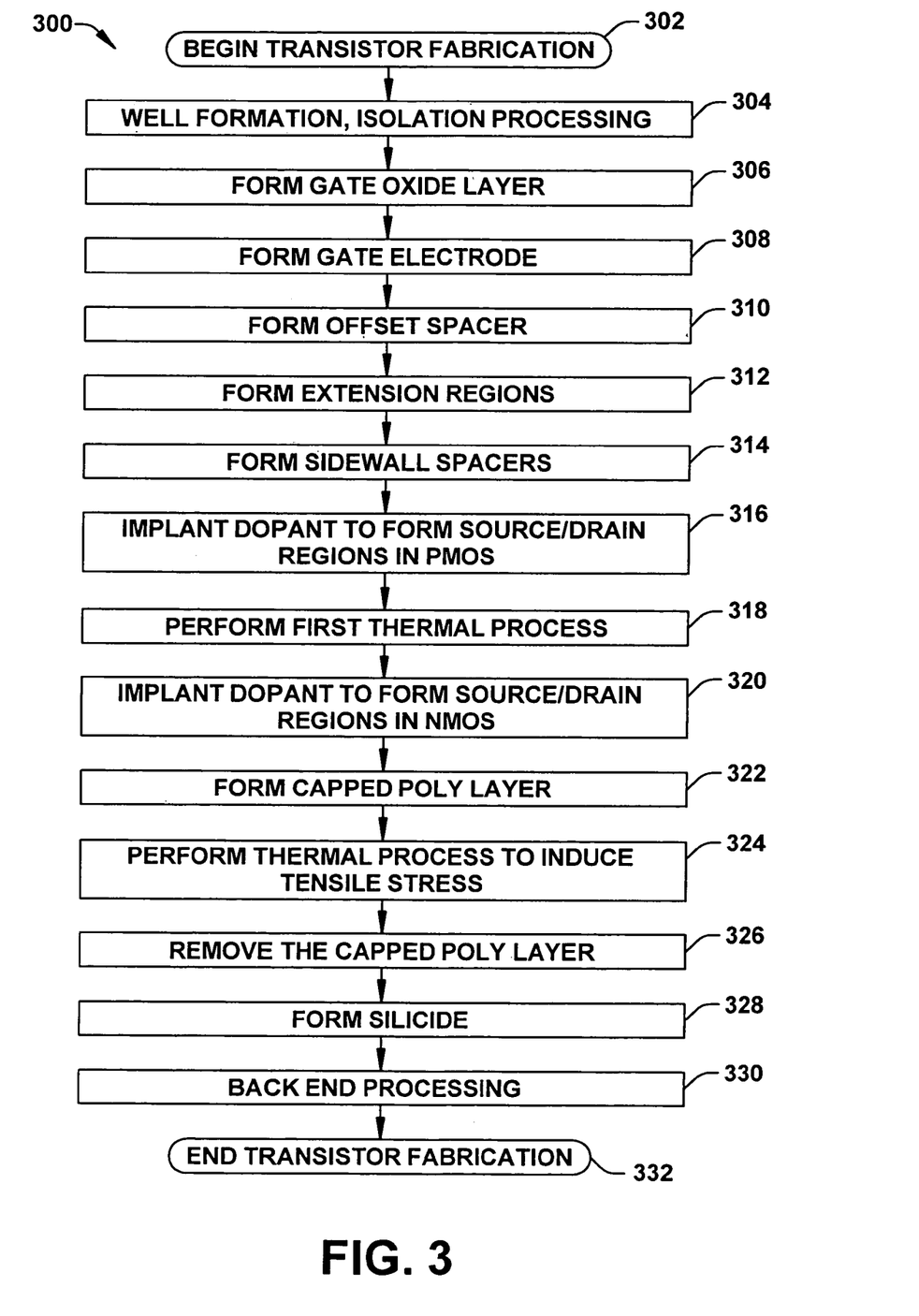
FIG. 3 is a flow diagram illustrating a method of fabricating a semiconductor device that applies tensile strain to the device, while mitigating undesired dopant diffusion in accordance with an aspect of the present invention.

Referring to FIGS. 3 and 4A–4M, further aspects of the invention relate to methods of fabricating semiconductor devices, wherein FIG. 3 illustrates an exemplary method of fabrication in accordance with the invention, and FIGS. 4A–4M illustrate the exemplary transistor device at various stages of fabrication in accordance with the invention.

FIG. 3 is a flow diagram illustrating a method 300 of fabricating a semiconductor device that applies tensile strain to the device, while mitigating undesired dopant diffusion in a PMOS region in accordance with an aspect of the present invention. While the exemplary method 300 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication of ICs and composite transistors illustrated and described herein, as well as in association with other transistors and structures not illustrated, including but not limited to NMOS and/or PMOS composite transistors.

The method 300 begins at 302, wherein transistor fabrication is initiated, and transistor well formation and isolation processing is performed at 304 thereby defining NMOS and PMOS regions, wherein NMOS regions comprise a p-well region in which n-type source/drain regions will later be formed, and PMOS regions comprise an n-well region in which p-type source/drain regions will later be formed, respectively. In addition, isolation regions may comprise shallow trench isolation (STI) or field oxide regions (LOCOS) that serve to define various active areas and electrically isolate various active areas laterally from one another.

The method 300 continues at 306, wherein a gate dielectric layer is formed in active areas defined by the various formed isolation regions. In one example, the gate dielectric layer comprises a thin, thermally grown silicon dioxide layer, however, other type gate dielectrics (such as high-k dielectrics) can be formed and are contemplated by the present invention. Subsequently, a conductive gate layer is then deposited over the gate dielectric layer at 308 and patterned to form gate structure. For example, a polysilicon layer may be deposited via chemical vapor deposition (CVD) and patterned via etching to form gate electrodes in both NMOS and PMOS regions, respectively.

An offset spacer is then formed on lateral edges of the gate structures at 310. For example, a thin offset layer (e.g., an oxide or nitride layer) is formed generally conformally over the patterned gate and then etched using a generally anisotropic dry etch to remove offset layer material on top of the gate and in the source/drain regions, leaving a thin offset spacer material on lateral edges of the gate.

An extension region implant is then performed at 312 to form extension regions, wherein dopants are introduced in active regions of the device. For example, lightly doped, medium doped or heavily doped extension region implants are performed in the NMOS and PMOS regions, respectively, wherein the gate structure serves to self-align the extension regions. A thermal process such as a rapid thermal anneal can then be employed to activate the extension region dopants, which causes the extension regions to diffuse laterally slightly underneath the offset spacer toward the channels.

Still referring to FIG. 3, sidewall spacers are then formed on the gate structures at 314. The sidewall spacers comprise an insulating material such as an oxide, a nitride or a combination of such layers. The spacers are formed by depositing a layer of such spacer material(s) over the device in a generally conformal manner, followed by an anisotropic etch thereof, thereby removing such spacer material from the top of the gate structure and from the moat or active area and leaving a region on the lateral edges of the gate structure, overlying the offset spacers. The sidewall spacers are substantially thicker than the offset spacers, thereby resulting in the subsequently formed source/drain regions to be offset from lateral edges of the gate.

Source/drain regions are then formed in the PMOS region by masking the NMOS region with a resist mask, exposing the PMOS region, and implanting p-type dopants (e.g., boron) at 316. The source/drain dopant is introduced into the exposed areas (top of gate electrode and active areas not covered by the sidewall spacers).

A thermal process is performed at block 318 that activates the implanted p-type dopants and drives the p-type dopants into underlying silicon or substrate. A capped poly layer is not present yet, and, as a result, loss of the implanted p-type dopant is mitigated in later thermal processes. The thermal process is typically a spike anneal, so as be compatible with a specified thermal budget. Generally, thermal budgets are set for fabrication of semiconductor devices in order to prevent or mitigate damage from overexposure the thermal processes. A suitable, exemplary spike anneal is about 900 to about 1050 degrees Celsius for a relatively short duration (e.g., about 5 seconds or less). However, it is appreciated that other thermal processes can be employed.

Subsequently, source/drain regions are formed in the NMOS region by masking the PMOS region with a resist mask, exposing the NMOS region, and implanting n-type dopants (e.g., phosphorous) at 320. The source/drain dopant is introduced into the exposed areas and at a selected dose and energy.

A capped poly layer, also referred to as a stacked poly cap or poly cap layer, is formed over the NMOS and PMOS regions of the semiconductor device at block 322. The capped poly layer is formed by depositing and/or growing one or more layers of materials (e.g., oxide, nitride, and the like) that introduce a desired type of strain in the NMOS region of the device when subjected to a thermal process. Generally, the capped poly layer is formed over active regions and gate electrodes of transistor devices in both the NMOS region and a PMOS region of the semiconductor device. A suitable capped poly layer is comprised of a lower insulative layer (e.g., oxide) and a middle layer formed on the lower layer comprised of a suitable material and thickness that introduces a desired amount of strain (e.g., nitride). However, the capped poly layer can comprise additional layers and/or other layers with varied compositions.

A second thermal process (e.g., an anneal) is performed at block 324 that causes the capped poly layer to introduce a type of strain (e.g., uniaxial tensile strain or biaxial tensile strain) across channel regions of transistor devices and enhance performance of transistor devices within the NMOS region. Additionally, the thermal process also serves to activate the source/drain regions formed within the NMOS region. A suitable thermal process is a spike anneal that occurs for a relatively short time at a high temperature (e.g., about 800 degrees Celsius to 1200 degrees Celsius). A thickness and/or composition of the capped poly layer determines the magnitude of strain introduced into the channel regions. The time and temperature of the anneal process can be selected to further select or adjust the amount of strain introduced. Typically, a higher temperature and/or longer time for the anneal process results in a greater amount of strain being applied.

It is noted that the formation of source/drain regions in the PMOS region and performance of the first thermal process mitigate diffusion of the implanted p-type dopants (e.g., boron) into the capped poly layer. Other conventional fabrication mechanisms can require a portion of the capped poly layer to be removed from the PMOS region, thereby requiring additional masks and processing steps.

Subsequently, the capped poly layer is removed at block 326, which allows additional fabrication procedures, such as silicidation and metallization, to be performed. One suitable mechanism to remove the capped poly layer is to employ a plasma dry etch selective to an underlying layer to remove the capped poly layer. For example, for a cap poly comprising an oxide covered by a nitride, a two-step etch process may be employed, wherein the first etch is selective to the oxide and the second etch is selective to the underlying layer. For a nitride containing capped poly layer as described above, a suitable etch process is a wet etch process that employs sulfuric acid.

The method 300 then concludes with silicide processing at 328, wherein a refractory metal material is formed over the device, followed by a thermal process, wherein the metal and silicon interfaces react to form a silicide (on top of the gate and in the source/drain regions). Unreacted metal is then stripped away, and back end processing such as interlayer dielectric and metallization layers are formed at 330 to conclude the device formation at 332.

Figure 4A:
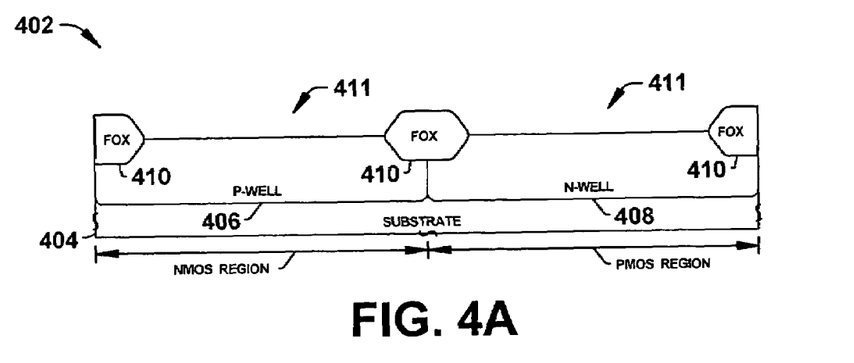
FIGS. 4A–4M are a plurality of fragmentary cross section diagrams illustrating a transistor device being formed in accordance with an aspect of the present invention.
Figure 4B:
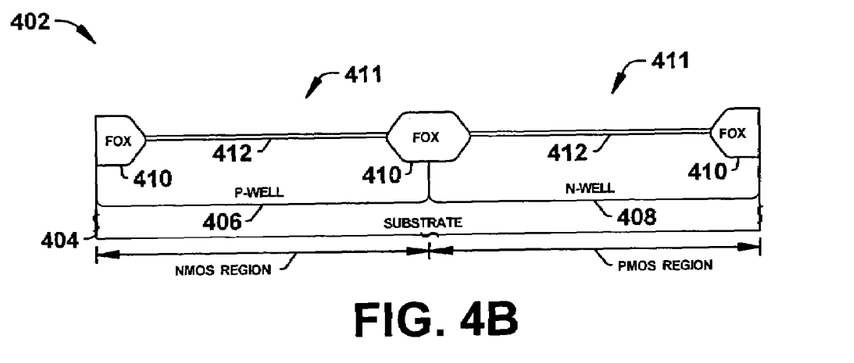

Turning now to FIGS. 4A–4M, a plurality of fragmentary cross section diagrams illustrating a transistor device being formed in accordance with the present invention by the method 300 of FIG. 3 is provided. In FIG. 4A, a transistor device 402 is provided, wherein a semiconductor body 404, such as a semiconductor substrate, has a number of wells formed therein, such as a p-well region 406 to define an NMOS transistor device region and an n-well region 408 to define a PMOS transistor device region, respectively. Further, isolation regions 410 such as STI regions are formed in the semiconductor body to define active area regions 411, as may be appreciated. In FIG. 4B, the transistor device 402 is illustrated, wherein a gate dielectric layer 412 has been formed, for example, by thermally grown $SiO_2$, over the active areas 411.

Figure 4C:
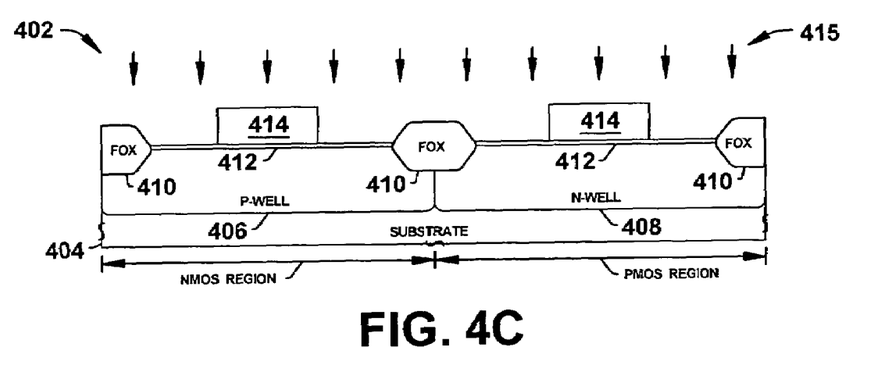
Figure 4D:
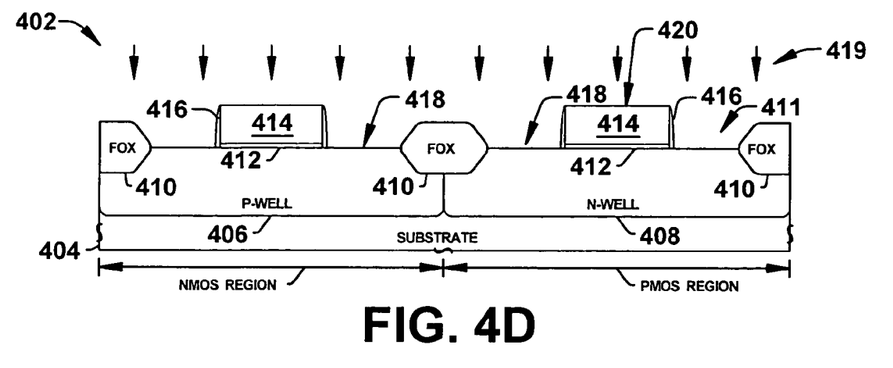

Referring to FIG. 4C, a conductive gate electrode material (e.g., polysilicon, doped polysilicon, and the like) has been deposited and patterned via an etching process 415 to form gate electrodes 414 overlying the gate oxide 412. Turning now to FIG. 4D, offset spacers 416 are then formed on the lateral edges of the gate electrode. The offset spacers 416 are comprised of an insulative material, such as nitride or oxide, and are relatively thin. The offset spacers 416 operate to protect the gate electrodes 414 and to align and define subsequently formed regions.

Figure 4E:
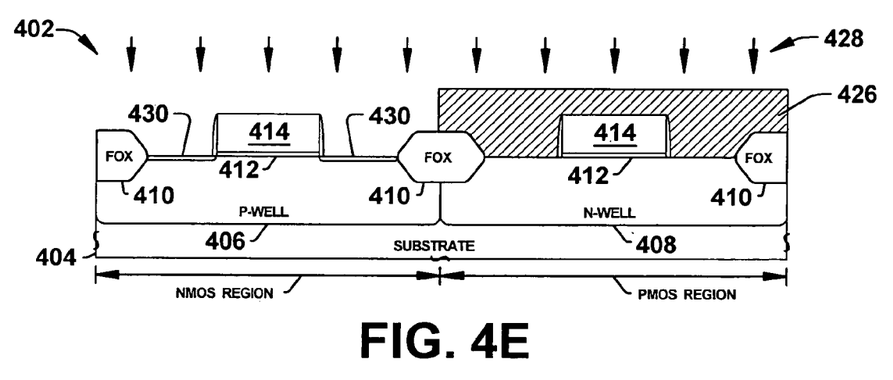
Figure 4F:
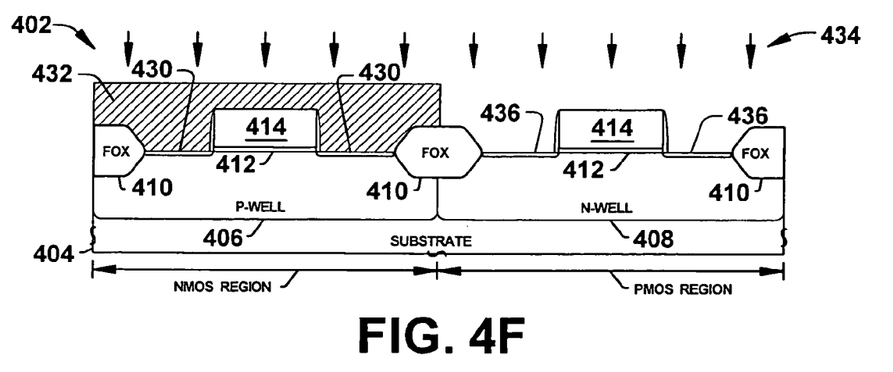

The PMOS region is then masked, as illustrated in FIG. 4E with a masking material 426 such as photoresist, and an extension region implant 428 is performed to form n-type extension regions 430 in the NMOS region. The n-type extension region mask 426 is then removed and a p-type extension region mask 432 is deposited and patterned to cover the NMOS region, as illustrated in FIG. 4F. A p-type extension region implant process 434 is performed to form p-type extension regions 436 in the PMOS region, as illustrated in FIG. 4F. The mask 432 is then removed and a thermal process such as a rapid thermal anneal is typically performed to activate the implanted dopants, wherein a lateral diffusion of the extension regions 430,436 under the offset spacers 416 can be achieved.

Figure 4G:
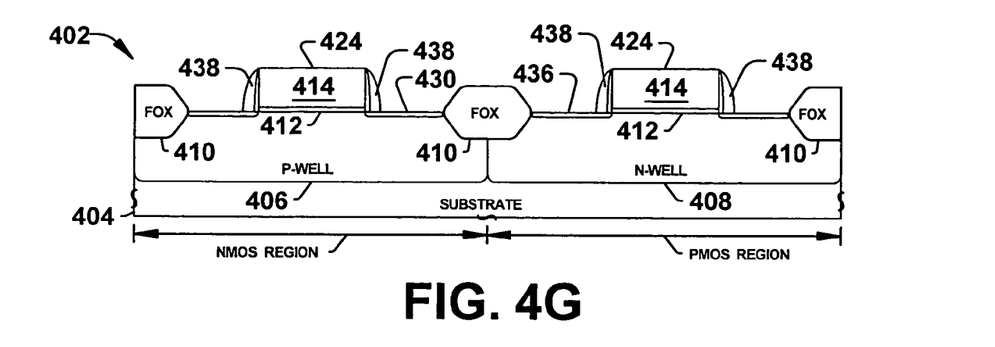

Sidewall spacers 438 are formed over the offset spacers 416 on the lateral edges of the gate structures as shown in FIG. 4G. To form the sidewall spacers 438, insulating sidewall material(s) are deposited in a generally conformal manner over the device and subsequently subjected to an anisotropic etch to remove the insulating material on top of the gate and over the active areas, leaving sidewall spacers 438 in both the NMOS and PMOS regions, as illustrated in FIG. 4G. Some examples of suitable insulative materials include oxide and nitride.

Figure 4H:
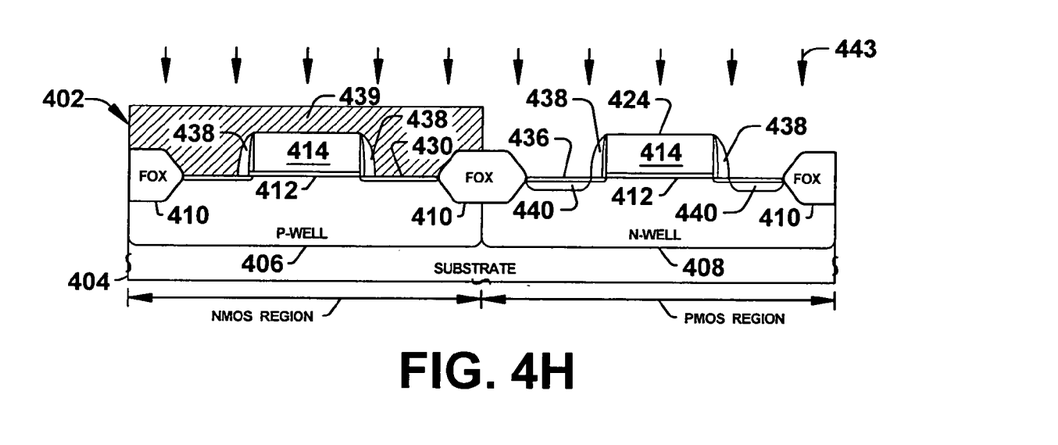
Figure 4I:
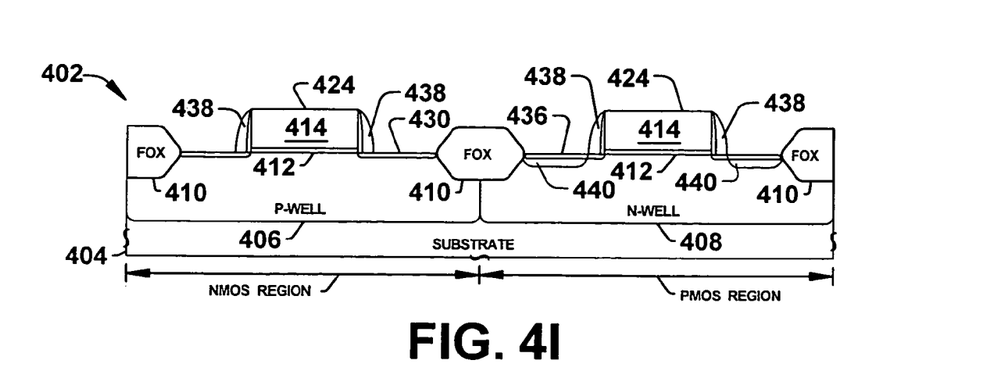

Source and drain regions 440 are formed in the PMOS region as shown in FIG. 4H. The source and drain regions 440 are formed by a source/drain implant 443 with a PSD mask 439 to implant a p-type dopant, such as boron, in the NMOS region. It is appreciated that variations of these masks can be employed in the present invention to implant p-type dopants. As can be seen in FIG. 4H, the source/drain regions 440 are self-aligned with respect to the sidewall spacers 438, and thus are laterally spaced from the extension regions 436. FIG. 4I illustrates the device after removal of the PSD mask 439 and also illustrates that the source/drain regions 440 are formed in the PMOS region, but source/drain regions are not yet formed in the NMOS region.

Subsequently, a thermal process is performed that activates the source/drain regions 440 and drives the implanted p-type dopants into underlying silicon or substrate 404. A capped poly layer is not present yet, and, as a result, loss of the implanted p-type dopant is mitigated in later thermal processes. The thermal process is typically a spike anneal, so as be compatible with a specified thermal budget. Generally, thermal budgets are set for fabrication of semiconductor devices in order to prevent or mitigate damage from overexposure the thermal processes. A suitable, exemplary spike anneal is about 900 to about 1050 degrees Celsius for a relatively short duration (e.g., about 5 seconds or less). However, it is appreciated that other thermal processes can be employed.

Figure 4J:
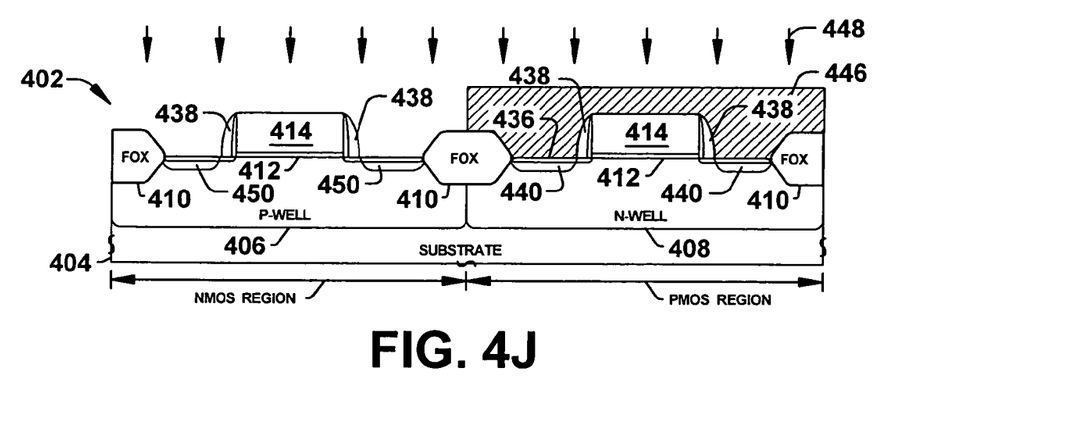

Source and drain regions 450 are formed in the NMOS region as shown in FIG. 4J. The source and drain regions 450 are formed by a source/drain implant 448 with an NSD mask 446 to implant an n-type dopant, such as phosphorous, in the PMOS region. It is appreciated that variations of these masks can be employed in the present invention to implant n-type dopants. As can be seen in FIG. 4J, the source/drain regions 450 are self-aligned with respect to the sidewall spacers 438, and thus are laterally spaced from the extension regions 430.

Figure 4K:
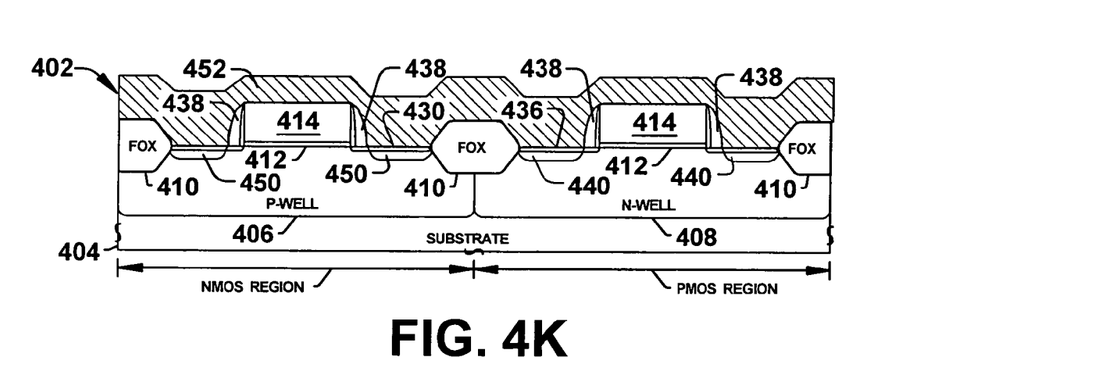

FIG. 4K illustrates the device 402 after removal of the NSD mask and forming a capped poly layer 452 over the device. The capped poly layer 452 is comprised of one or more layers of which one is comprised of a stress inducing material, such as nitride. It is noted that a portion of the capped poly layer 452 is not required to be removed from the PMOS region because the source/drain regions 440 within the PMOS region have been activated and their implanted dopants driven into the substrate 404.

A second thermal process (e.g., an anneal) is performed that causes the capped poly layer 452 to introduce a type of strain (e.g., uniaxial tensile strain or biaxial tensile strain) across channel regions of transistor devices and enhance performance of transistor devices within the NMOS region. A suitable thermal process is a spike anneal that occurs for a relatively short time at a high temperature (e.g., about 800 degrees Celsius to 1200 degrees Celsius). A thickness and/or composition of the capped poly layer 452 determines the magnitude of strain introduced into the channel regions. The time and temperature of the anneal process can be selected to further select or adjust the amount of strain introduced. Typically, a higher temperature and/or longer time for the anneal process results in a greater amount of strain being applied.

It is noted that the formation of source/drain regions 440 in the PMOS region and performance of the first thermal process mitigate diffusion of the implanted p-type dopants (e.g., boron) into the capped poly layer 452. Other conventional fabrication mechanisms can require a portion of the capped poly layer to be removed from the PMOS region, thereby requiring additional masks and processing steps.

Figure 4L:
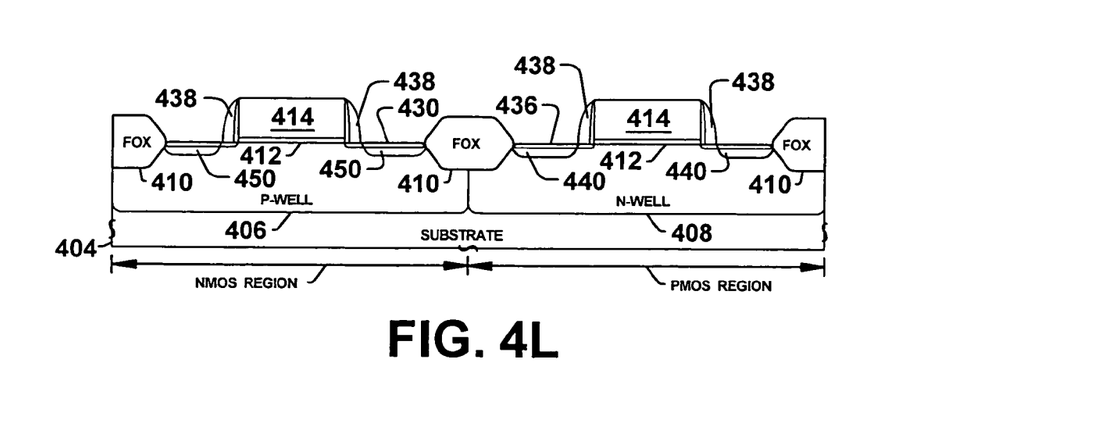

Subsequently, the capped poly layer 452 is removed, as shown in FIG. 4L. A suitable process employed to remove the capped poly layer 452 is a wet etch process, such as one employing sulfuric acid. However, it is appreciated that other types of etching can be performed to remove the capped poly layer 452 in accordance with the present invention. A thermal process (e.g., spike anneal, rapid thermal anneal, and the like) is performed that, in combination with the capped poly layer 452, induces the desired type and amount of strain within channel regions of NMOS transistor devices. A time and temperature employed in the thermal process are selected according to characteristics of the transistors being formed, composition of the capped poly layer 452, and the desired type and amount of strain to be induced. Degradation of PMOS transistor devices by the capped poly layer 452 is mitigated because it is not substantially present within the PMOS region yet channel mobility for NMOS devices is improved as a result.

Figure 4M:
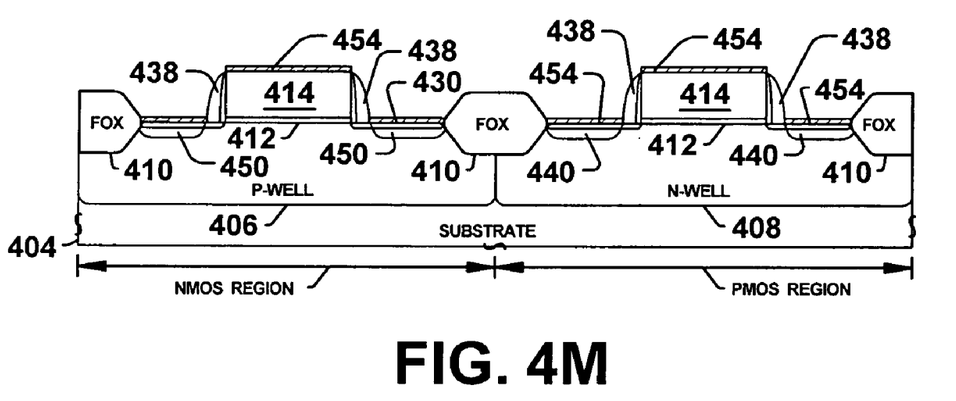

Continuing, silicide regions 454 are formed on source/drain regions 440 and 450 and gate electrodes 414 by a suitable silicidation process. FIG. 4M depicts the semiconductor device after formation of the silicide regions. Typically, silicide regions are formed by depositing a refractory metal (e.g., aluminum, cobalt, alloys thereof, and the like) is over the device and inducing (e.g., by annealing) the deposited refractory metal to react with underlying silicon forming silicide regions that reduce contact resistance between active regions and electrodes with contacts, interconnects, and the like. Un-reacted refractory metal is then removed. Subsequently, back end processing, including metallization to interconnect the various transistors, may be performed, as may be desired.

It is appreciated that the views and the exemplary device 402 described in FIGS. 4A to 4M are exemplary in nature and that the present invention is not limited to the composition, dimensions, and structure depicted therein. It is noted that the present invention includes other transistor devices, but with varied materials and compositions.

While, for purposes of simplicity of explanation, the methodologies of FIGS. 1 and 3 are depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of fabricating a semiconductor device comprising:
   forming source/drain regions in active areas of a PMOS region;
   performing a first thermal process that activates the formed source/drain regions in the PMOS region;
   forming source/drain regions in active areas of an NMOS region;
   forming a capped poly layer over the NMOS region and a PMOS region of the semiconductor device, subsequent to performing the first thermal process; and
   performing a second thermal process that induces strain from the capped poly layer into channel regions of the NMOS region, wherein the induced strain improves channel mobility within the NMOS region without substantially degrading channel mobility within the PMOS region.

2. The method of claim 1, further comprising forming gate electrodes in the PMOS region and the NMOS region prior to forming the source/drain regions in the active areas of the PMOS region.

3. The method of claim 2, further comprising forming well regions and isolation regions in a semiconductor substrate of the PMOS and NMOS regions prior to forming the gate electrodes.

4. The method of claim 3, further comprising forming extension regions in the PMOS and NMOS regions prior to forming the capped poly layer.

5. The method of claim 1, further comprising removing the capped poly layer subsequent performing the thermal process.

6. The method of claim 1, wherein the capped poly layer is formed by depositing a lower oxide layer over the device and depositing a nitride layer on the lower oxide layer.

7. The method of claim 6, wherein the nitride layer is deposited to a thickness selected according to a desired amount of induced tensile strain.

8. The method of claim 1, wherein the first thermal process is a spike anneal performed at a temperature within the range of about 900 to 1050 degrees Celsius.

9. The method of claim 1, wherein the first thermal process is performed for a time and temperature selected to mitigate dopant diffusion from the source/drain regions within the PMOS region into the capped poly layer during the second thermal process.

10. The method of claim 8, wherein the second thermal process is a spike anneal performed at a temperature selected according to a desired amount of induced strain.

11. The method of claim 1, wherein forming the source/drain regions in the PMOS regions comprises implanting a p-type dopant.

12. The method of claim 11, wherein performing the first thermal process drives in the implanted p-type dopant.

13. A method of fabricating a semiconductor device comprising:
performing well formation and isolation processing in a semiconductor body;
forming a gate dielectric layer on the semiconductor body;
forming a conductive gate layer on the gate dielectric layer;
patterning the gate dielectric layer and the conductive gate layer to form gate structures;
forming offset spacers on lateral edges of the gate structures;
forming extension regions in the semiconductor body in NMOS and PMOS regions;
forming sidewall spacers adjacent the offset spacers;
implanting p-type dopant(s) to form source/drain regions in the PMOS region;
performing a first thermal process to activate the source/drain regions in the PMOS region and drive in the implanted p-type dopant(s);
subsequent to performing the first thermal process, implanting n-type dopant(s) to form source/drain regions in the NMOS region;
forming a capped poly layer over the device; and
performing a second thermal process to induce tensile strain into channel regions of the NMOS region.

14. The method of claim 13, wherein performing the second thermal process comprises performing a spike anneal.

15. The method of claim 13, further comprising removing the capped poly layer via a wet etch process.

16. The method of claim 13, wherein the capped poly layer comprises nitride.

17. The method of claim 13, wherein the capped poly layer comprises oxynitride.

18. A method of fabricating a semiconductor device comprising:
performing well formation and isolation processing in a semiconductor body;
forming gate structures comprised of a gate dielectric layer and a conductive gate layer;
implanting a first type dopant to form source/drain regions in a first region;
performing a first thermal process to activate the source/drain regions in the first region and drive in the implanted first type dopant;
subsequent to performing the first thermal process, forming a capped poly layer over the device; and
performing a second thermal process to induce a type and amount of strain into channel regions within the first region, wherein the type and amount of strain is selected to improve channel mobility of devices within the first region.

19. The method of claim 18, further comprising selecting a temperature and duration for the first thermal process that mitigates diffusion of the implanted first type dopants during the second thermal process.

20. The method of claim 18, wherein the first type dopant is boron.

* * * * *